United States Patent
Yoshida et al.

(10) Patent No.: US 6,319,725 B1
(45) Date of Patent: Nov. 20, 2001

(54) METHOD FOR ESTIMATING COMPOSITION OF PRODUCT OBTAINED BY LIQUEFACTION OF COAL

(75) Inventors: Ryoichi Yoshida; Tadashi Yoshida, both of Eniwa; Mitsuyoshi Yamamoto, Sapporo; Hiroshi Nagaishi, Sapporo; Masahide Sasaki, Sapporo, all of (JP)

(73) Assignee: Agency of Industrial Science and Technology (JP)

( * ) Notice: Subject to any disclaimer, the term of this patent is extended or adjusted under 35 U.S.C. 154(b) by 0 days.

(21) Appl. No.: 09/538,740

(22) Filed: Mar. 30, 2000

(51) Int. Cl.$^7$ .................................................. G01N 24/00
(52) U.S. Cl. ........................ 436/173; 208/400; 436/25; 436/139; 436/140; 436/145
(58) Field of Search .............................. 436/173, 25, 139, 436/140, 145; 208/400

(56) References Cited

FOREIGN PATENT DOCUMENTS

09133644 A * 5/1997 (JP).
09241649 A * 9/1997 (JP).

OTHER PUBLICATIONS

Gagarin et al., "Evaluation of the degree of aromaticity of the structure of brown coals", Khim. Tverd. Topl. (Moscow), 1993, (1), p. 3–11 (Abstract).*
Nomura et al. "Strucutral Evaluation of Zao Zhuang Coal", Energy Fuelas, 1998, v. 12, pp. 512–523.*
Song et al. "CPMAS 13C NMR and pyrolysis–GC–MS studies of structure and liquefaction reactions of Montana subbituminous coal", Fuel Process. Technol., 1993, v. 34, pp. 249–276.*
Yoshida et al. "Liquefaction reaction of coal. 2. Structural correlation between coal and its liquefaction products", Fuel, 1985, v. 64, pp. 897–901.*
Konig et al. "Characterization parameters for oil formation from brown coal hydrogenation", Fuel Process. Technol., 1990, V. 24, pp. 217–223.*
Franco et al. "Characterization by 13C CP/MAS NMR spectroscopy of structural changes in coals after chemical treatments", Fuel, 1991, V. 70, pp. 811–817.*
Solum et al. "Coal liquefaction process streams characterization and evaluation:", Report (1992), DOE/PC89883–65; from Energy Res. Abstr., 1993, V.18(5), Abstr. No. 11675.*
Schmit–Quiles et al. "Computer aided analysis of 13C NMR psectra of multicomponent mixtures:4", Fuel, 1994, v. 73 (6), pp. 980–983.*
Burgess et al. "Relationship of coal characteristics determined by pyrolysis/gas chromatography/mass spectrometry and nuclear magnetic resonance to liquefaction reactivity and product composition", Energy Fuels, 1998, v. 12, pp. 1212–1222.*
Delpuech et al. "Structural and Dynamic NMR studies of Coals", Exp. Tech. Phys., 1988, 36(4/5), pp. 305–313.*
Cyr et al., "Characterization of coal liquefaction residues by solid–state 13C NMR spectroscopy", Adv. Chem.Ser. (1993), 229(Magnetic Resonance of Carbonaceous Solids), 281–94.*
Mae et al. "Effect of coal structure on thermal degradation of coal", DGMK Tagungsberg, 1997, Proceedings ICCS '97, v. 1), 195–198.*

* cited by examiner

Primary Examiner—Jill Warden
Assistant Examiner—Yelena G. Gakh
(74) Attorney, Agent, or Firm—Lorusso & Loud

(57) ABSTRACT

The present invention provides a method of estimating ingredients of liquefaction products of coal or its analogues from a resonance spectrum thereof obtained using their solid state $^{13}$C nuclear magnetic resonance spectrometer. The method comprises the first step of obtaining a resonance spectrum of coal or its analogues using a solid state $^{13}$C nuclear magnetic resonance spectrometer, the second step of determining distribution of various types of carbon having different linkage types which constitute the molecular structure of the coal or its analogues, and the third step of estimating ingredients of liquefaction products of the coal or its analogues on the basis of the determined carbon distribution.

1 Claim, 2 Drawing Sheets chemical shift (ppm)

METHOD FOR ESTIMATING COMPOSITION OF PRODUCT OBTAINED BY LIQUEFACTION OF COAL

BACKGROUND OF THE INVENTION

This invention relates to a method of estimating ingredients of liquefaction products of coal or its analogues from a resonance spectrum thereof obtained using a solid state $^{13}C$ nuclear magnetic resonance spectrometer.

Coals are more widely spread in the world as compared with petroleum and natural gas. The estimated amount of available coal deposits is about 1 trillion tons. These fossil resources are estimated to be recoverable for another 216 years for coal, 46 years for petroleum and 64 years for natural gas, and it is considered that these fossil resources will be important energy resources for human society as ever. At present, about one third of the amount of the primary energy consumed in the world is dependent on coal, and approximately 120 Mt/y of coal is consumed in the steel industry and the field of electric power generation in Japan.

It is known, however, that coal generates more carbon dioxide per unit heating value than petroleum and natural gas and also generates a large quantity of sulfur dioxide, nitrogen dioxide, soot out dust and so on. Therefore, in order to utilize coal resources with the consideration of the protection of environment, it is necessary to develop an energy-efficient and low-emission coal conversion technology. For example, in the field of the environmentally friendly electric power generation, technologies for pressurized fluidized bed combined power generation and coal gasification combined cycle power generation are under development with the aim of improving generation efficiency. In the steel industry, the development of a new technology for producing coke for iron manufacturing is in progress.

On the other hand, it is expected that petroleum will be in short supply with respect to increasing demand thereof in the near future. Then, a coal liquefaction technology for producing gasoline and light oil from coal has been promoted as a technology for manufacturing substitute fuel for petroleum, and, as a consequence, NEDOL process has been established. At present, technology transfer of the process to countries, such as Indonesia and China, that are making remarkable economic growth and suffering from energy shortage, is under consideration.

The main elements of coal are carbon, hydrogen and oxygen, and the chemical structure thereof is characterized in that structural units consisting of condensed polycyclic aromatic compounds having various numbers of rings are linked to each other through methylene crosslinks or ether bonds to form chemically inconsistent polymeric structure. Heteroatoms such as oxygen, sulfur and nitrogen exist as various functional groups bonded around aromatic rings with an alkyl side chain or as heterocyclic compounds in which they are incorporated within rings. Generally, as the rank of coalification proceeds from brown coal to bituminous coal, the proportion of condensed polycyclic aromatic compounds contained therein increases and the chemical structure thereof continuously changes and tend to be stabilized chemically. Additionally, coal typically contains approximately a few to 30% of ashes, which can be a cause of troubles such as abrasion of the equipment and clogging by fusion in coal utilization processes.

A liquefaction reaction of coal is a conversion reaction technology as a technology of manufacturing substitute fuel for petroleum from coal aiming at manufacture of liquid transportation fuels such as gasoline and light oil. In contrast to combustion or gasification, which occurs at high temperature beyond 800° C., a liquefaction reaction decomposes coal under high-pressure hydrogen of 10 to 25 Mpa, and under a mild reaction condition of a temperature of 430 to 470° C., to produce oil which is a mixture of low molecular weight aromatic and aliphatic hydrocarbon. The reaction starts with cleavage of crosslinks between structural units and functional groups with low bonding energy, and then goes to the decomposition into smaller molecules of preasphaltene and asphaltene fractions. There follows the formation of cycloparaffin and its analogues and ring-opening reactions thereof into lower molecular weight substances by hydrogenation of aromatic rings, thereby producing oils along with gases. Thus, it is known from basic studies in the past that liquefaction reactivity of coal is strongly influenced by the chemical structure thereof, i.e. the proportion of aromatic ring structures and crosslinks, the quantity of oxygen-containing functional groups and so on.

After the "oil crisis" in 1973, development researches on the coal liquefaction technology were vigorously pursued as a national project aiming at decrease of dependence on petroleum and diversification of energy resources in Japan. As a result, the liquefaction technology in Japan established NEDOL process with the highest performance in the world through a test operation using a 1 t/d process—supporting apparatus and a 150 t/d pilot plant. The process is designed to be applicable to a wide variety of coals from sub-bituminous coal to bituminous coal in consideration of the energy situation in Japan in which coal resource also must be imported from abroad and is a technologically and economically advanced liquefaction technology peculiar to Japan. Liquefied oil can be produced under mild reaction conditions with a high yield by employing an iron-based particulate catalyst and hydrogen donor solvent. The typical reaction conditions thereof involve a reaction temperature of 440 to 470° C., a reaction pressure of 15 to 20 Mpa, a concentration of coal slurry of 40 to 50%, an amount of added catalyst of 1.5 to 3% and a gas/liquid ratio of 0.7 to 1.0 $Nm^3/kg$. As a result, an oil yield (boiling point: $C_4$ to 350° C. fraction) between 50 and 60 wt % (about 4 barrels per 1 ton of coal) can be obtained.

At present, at the request from Indonesia and China, feasibility studies on transferring the process to those countries are now conducted and it is expected to contribute greatly to stabilized energy supply in Asian countries.

As mentioned before, liquefaction reactivity of coal is highly dependent on the chemical structure thereof, i.e. the type of the coal so that yields of oil and other products vary according to the type of the coal. In order to obtain a high yield of oil, on which the cost effectiveness of the process depends, an optimum reaction condition of each type of coal must be discovered. For that purpose, however, it is necessary to carry out reaction tests in a plant and a large amount of costs, efforts and time is required to obtain reaction data of each coal. That is the reason why a convenient method of estimating reactivity has long been desired.

In spite of this, no suitable method to determine chemical structure of coal had been established. However, a solid state $^{13}C$ nuclear magnetic resonance spectrometer was recently developed and it has become possible to measure carbon distribution of coal. Although the instrument cannot directly determine distribution of a variety of chemical structures of coal, it shows carbon distribution corresponding to an average chemical structure of coal, which leads to a conclusion that there must be a close relation between carbon distribution and reactivity.

However, no appropriate method of analyzing spectral data of coal to determine a correlation between carbon distribution and liquefaction reactivity of coal has been established yet. Also, most of the reaction tests to determine liquefaction reactivity are carried out by using small-scale batch-type autoclaves so that obtaining quantitative reaction data under a steady condition has been very limited. Under these constraints, it was virtually impossible to find out a correlation between chemical structure of coal and liquefaction reactivity thereof with high accuracy.

SUMMARY OF THE INVENTION

The present invention has been made in view of the situation of the prior art and aims at the provision of a method of estimating ingredients of liquefaction products of coal or its analogues from a resonance spectrum thereof obtained using a solid $^{13}C$ state nuclear magnetic resonance spectrometer.

As a result of our intensive researches to solve above problems, the present invention has been eventually accomplished.

Namely, the present invention provides a method of estimating ingredients of coal or its analogues which comprises;

the first step of obtaining a resonance spectrum of coal or its analogues using a solid state 13C nuclear magnetic resonance spectrometer, the second step of determining distribution of various types of carbons having different linkage types which constitute the molecular structure of the coal or its analogues from the thus obtained resonance spectrum, and the third step of estimating ingredients of coal liquefaction products of the coal or its analogues on the basis of the determined carbon distribution.

In a preferred embodiment, in the second step, the resonance spectrum is deconvoluted into 24 peaks according to a predetermined standard to determine each peak intensity from which distribution of respective carbons is determined.

In another preferred embodiment, in the second step, carbons constituting the molecules of the coal or its analogues are classified into 9 carbon groups consisting of carbonyl group, carboxyl group, aromatic carbon bonded to an oxygen atom, aromatic carbon bonded to a carbon atom, aromatic carbon bonded to a hydrogen atom, aliphatic carbon bonded to a hydroxyl group or an etheric oxygen, methoxyl group, methylene group and methyl group. The 24 peaks are grouped into 9 carbon groups and distribution of each carbon is determined.

In a still another preferred embodiment, in the third step, ingredients of liquefaction products of coal or its analogues are estimated based on a correlation equations previously established using standard samples.

In a further preferred embodiment, ingredients to be estimated are at least one of the fractions selected from the group consisting of hydrocarbon gas, $CO_x$ gas, water, oil and residues.

Examples of the above mentioned correlation equations are shown in Table 3 presented afterwards.

DETAILED DESCRIPTION OF THE PREFERRED EMBODIMENT OF THE INVENTION

The method of the present invention will be described in detail below.

The present invention relates to a method of estimating ingredients of liquefaction products of coal (anthracite, strongly coking coal, caking coal, weakly coking coal, bituminous coal, brown coal, lignite, peat and so on) and its analogues.

The present invention includes broadly the following three steps;

(1) the first step of obtaining a resonance spectrum of coal or its analogues by using a solid state $^{13}C$ nuclear magnetic resonance spectrometer, (2) the second step of determining distribution of various types of carbon having different linkage types which constitutes the molecular structure of the coal or its analogues from the thus obtained resonance spectrum, and (3) the third step of estimating ingredients of liquefaction products of the coal or its analogues on the basis of the determined carbon distribution.

In the first step, a coal or its analogues to be measured (which may be hereinafter referred to as "sample coal" for brevity) is pulverized into particles of about 100 mesh, dried and then measured for its resonance spectrum using a solid state $^{13}C$ nuclear magnetic resonance spectrometer. This spectrum may give a pattern as illustrated by the solid line in FIG. 1.

It the second step, the spectrum obtained as above is deconvoluted into 24 peaks according to a peak pattern analyzing program employing predetermined analysis conditions to determine each peak intensity. Those data are grouped into 9 carbon groups to determine carbon distribution of the sample coal.

Figure 1:
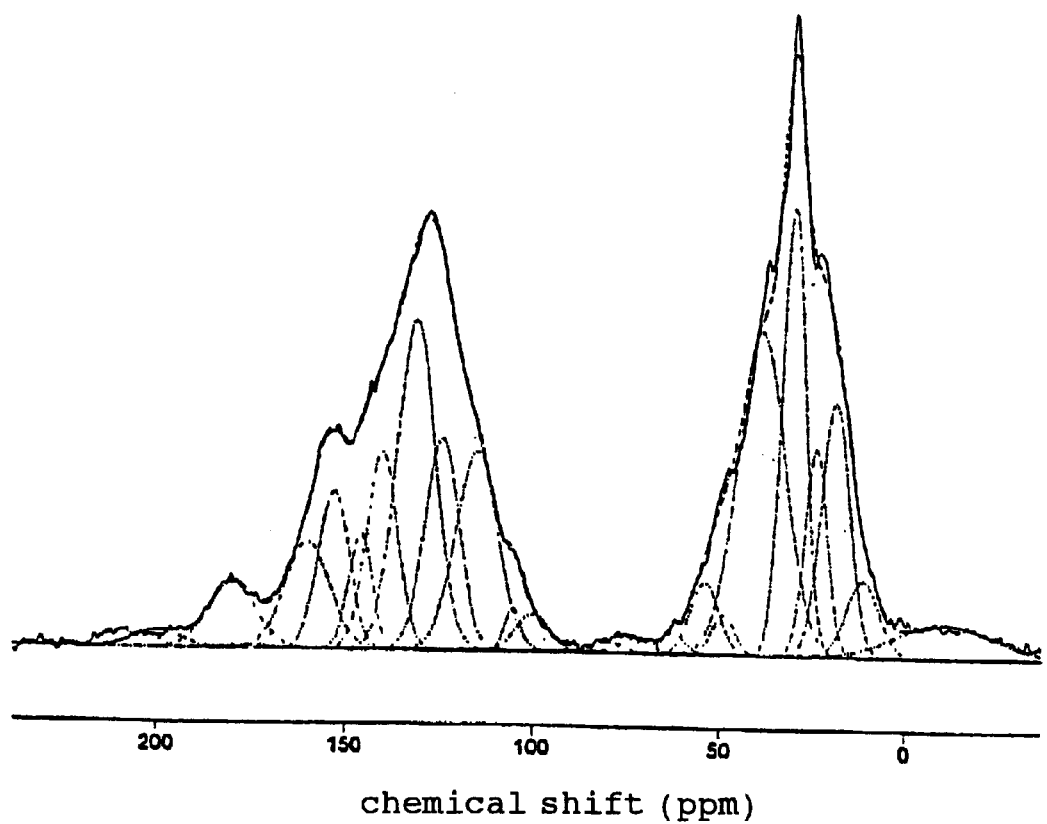
FIG. 1 is a diagram showing an example of a coal spectrum measured with a solid state $^{13}C$ nuclear magnetic resonance spectrometer and an example of composite spectra consisting of 24 peaks determined according to the peak deconvolution conditions shown in Table 1.

Now the analysis condition will be described. In FIG. 1, there are shown an example of a coal spectrum measured with a solid state $^{13}C$ nuclear magnetic resonance spectrometer and an example of composite spectra consisting of 24 peaks determined according to the peak deconvolution conditions shown in Table 1. Generally, $^{13}C$ nuclear magnetic resonance spectrum of coal is measured between 0 and 200 ppm in chemical shift. The range between 0 and about 90 ppm is assigned to aliphatic carbons and the range between about 90 and about 170 ppm is assigned to aromatic carbons. A spectrum of coal is very complicated because of the diversity of the chemical structure thereof. Therefore, it is virtually impossible to unconditionally determine the chemical shift range of each carbon group based on the data of standard compounds which are simple in structure.

Thus, in the present invention, peak information for different chemical structures was examined in detail by using samples prepared by dividing brown coal, which was rich in various types of oxygen-containing functional groups, into fractions of different components along with standard compounds similar to coal in structure. As a result, the peak deconvolution conditions represented in Table 1, i.e. chemical shift values and half-value widths for the 24 peaks were obtained.

Use of those data as predetermined analysis conditions makes it possible to analyze spectrum of a coal in any rank of coalification from brown coal to anthracite under the same conditions, and, consequently, to determine carbon distribution with high accuracy. Intensity of spinning side bands observed between 30 and 10 ppm and between 250 and 300 pm is added to the intensity of Ar—H carbon in determining carbon distribution.

TABLE 1

|  | Peak No. | Peak Position (ppm) | Half-value width (ppm) | Assignment of Carbon |
|---|---|---|---|---|
| Side Band | Spinning | (−30)–(−10) | <30 | |
| Aliphatic | 1 | 11.3 | <12 | $CH_3$ |
|  | 2 | 18.8 | 9 | |
|  | 3 | 24–26 | 7 | $CH_2$ |
|  | 4 | 30–35 | <10 | |
|  | 5 | 38.9 | 15 | |
|  | 6 | 49 | 7 | |
|  | 7 | 54–56 | <10 | $OCH_3$ |
|  | 8 | 62.5 | <10 | |
|  | 9 | 72–75 | <10 | R—OH |
|  | 10 | 80 | 9 | C—O |
|  | 11 | 84 | 7 | |
|  | 12 | 89 | 4 | |
| Aromatic | 13 | 100 | <10 | Ar—H |
|  | 14 | 105 | 5 | |
|  | 15 | 114–116 | <13 | |
|  | 16 | 124 | <12 | |
|  | 17 | 131 | 12 | Ar—C |
|  | 18 | 140–141 | <12 | |
|  | 19 | 145–146 | <12 | Ar—O |
|  | 20 | 150–153 | <14 | |
|  | 21 | 160 | <14 | |
|  | 22 | 175 | 15 | COOH |
|  | 23 | 180 | 15 | |
|  | 24 | 200 | 15 | C=O |
|  | Spinning Side Band | 250–300 | <20 | |

Using the above analysis conditions, the spectrum is deconvoluted into 24 peaks according to a peak pattern analysis program. Then, intensity and half-value width of each peak deconvoluted as above is determined.

Here, carbons constituting molecules of sample coal are grouped into 9 carbon groups consisting of carbonyl group, carboxyl group, aromatic carbon bonded to an oxygen atom, aromatic carbon bonded to a carbon atom, aromatic carbon bonded to a hydrogen atom, aliphatic carbon bonded to a hydroxyl group or an etheric oxygen, methoxyl group, methylene group and methyl group. The 24 peaks are classified according to the 9 carbon groups in the manner as represented in Table 1. The distribution of each carbon group is determined from the data of the 24 peaks divided as above. Table 2 shows examples of carbon distribution determined on several samples.

TABLE 2

| Coal | C (%) | C=O | COOH | Ar—O | Ar—C | Ar—H |
|---|---|---|---|---|---|---|
| Adaro | 73.4 | 1.4 | 3.8 | 13.3 | 18.3 | 22.6 |
| Wyoming | 75.6 | 1.2 | 3.9 | 12.8 | 20.1 | 22.1 |
| Tanito Harum | 76.6 | 0.8 | 3.2 | 12.3 | 18.7 | 20.3 |
| Wandoan | 78.1 | 0.9 | 2.8 | 9.6 | 20.1 | 24.1 |
| Yi Lan | 80.1 | 0.5 | 2.1 | 11.8 | 22.9 | 28.0 |
| Shen Hua | 81.4 | 0.6 | 1.9 | 11.7 | 25.3 | 30.2 |
| Ikejima | 83.0 | 0.0 | 0.5 | 9.7 | 24.6 | 30.6 |

|  | —O— | —OCH₃ | —CH₂ | —CH₃ | fa | O/C (%) |
|---|---|---|---|---|---|---|
| Adaro | 0.8 | 2.2 | 29.3 | 8.5 | 0.541 | 23.0 |
| Wyoming | 0.7 | 2.5 | 29.3 | 7.5 | 0.549 | 22.4 |
| Tanito Harum | 0.9 | 2.5 | 31.4 | 9.8 | 0.514 | 20.5 |

TABLE 2-continued

| Wandoan | 0.3 | 1.1 | 31.2 | 10.0 | 0.538 | 16.3 |
| Yi Lan | 0.3 | 1.6 | 23.6 | 9.1 | 0.627 | 17.0 |
| Shen Hua | 0.5 | 2.1 | 22.2 | 5.5 | 0.671 | 16.7 |
| Ikejima | 0.5 | 2.2 | 23.9 | 8.0 | 0.649 | 11.1 |

In the third step, the ingredients of liquefaction products of the coal or its analogues are estimated based on correlation equations previously established using standard samples. The ingredients to be estimated here may be, for example, hydrocarbon gas, $CO_x$ gas, water, oil and residues. As the above mentioned correlation equations, equations represented in Table 3 may be used. Thus, the yield of each liquefaction product of an unknown sample coal can be estimated by the foregoing method.

TABLE 3

| Hydrocarbon Gas | Hydrocarbon Gas (wt %) = 0.33 x ($CH_2$ + $CH_3$) % − 6.15 |
| COx Gas | $O_{COX}$ (wt %) = 1.43 x ($C_{C=O+COOH}$) % − 1.45 |
| Water | $O_{H2O}$ (wt %) = 2.03 x ($C_{Ar-O-OCH3}$) % − 10.84 |
| Oil | Oil (wt %) = 0.86 x $CH_2$ % + 27.5 |
| Residues | Residues (wt %) = 122.0 fa − 49.2 |

The yields estimated as above will be next compared with reactivity data obtained under a standard condition of NEDOL process.

In Table 2, there are shown the percentages of carbon content (Cwt %) of feed coals used in reaction tests with a 1 t/d NEDOL process plant, carbon distributions thereof determined with a solid state $^{13}C$ nuclear magnetic resonance spectrometer, and fraction of aromatic carbons (fa) and O/C ratio (%) thereof calculated from data of the carbon distribution. The used coals were sub-bituminous coals and low-rank bituminous coals. As the value of Cwt % increases, the fa value tends to rise, which means that aromatic structure of the coals develops; whereas the value of O/C decreases, which means that oxygen-containing functional groups decrease.

On the other hand, in Table 4, the result of liquefaction reaction tests carried out under a standard condition with a 1 t/d NEDOL process plant is shown. The reaction conditions were such that the reaction temperature was 465° C., the reaction pressure was 17 Mpa, the gas/liquid ratio was 0.7 Nm³/kg, the concentration of coal slurry was 40 wt % and the concentration of catalyst was 3 wt %. The yields of hydrocarbon gas were between 15 and 20 wt % but those of CO, CO2, and produced water increased significantly as Cwt % of coal increased. As for oil yield, no significant differences were noticed among the type of coals, but that of residues tended to increase with the increase in Cwt % of coal.

TABLE 4

| | Yields (wt %) | | | | |
|---|---|---|---|---|---|
| Coal | Hydrocarbon gas | $CO_x$ | Water | Oil | Residues |
| Adaro | 18.9 | 8.8 | 12.2 | 50.8 | 16.2 |
| Wyoming | 18.3 | 8.7 | 11.7 | 51.1 | 17.0 |
| Tanito Harum | 19.7 | 5.8 | 11.5 | 55.5 | 14.4 |
| Wandoan | 19.1 | 6.1 | 8.8 | 51.0 | 21.3 |
| Yi Lan | 17.9 | 3.7 | 8.2 | 52.6 | 23.8 |
| Shen Hua | 15.2 | 2.9 | 8.6 | 46.4 | 32.8 |
| Ikejima | 20.0 | 1.6 | 5.1 | 48.9 | 30.4 |

Reaction conditions:

Temperature: 465° C., Pressure: 17 MPa, Gas/Liquid Ratio:

0.7 Nm³/kg, Concentration of Coal Slurry: 40 wt %

Figure 2:
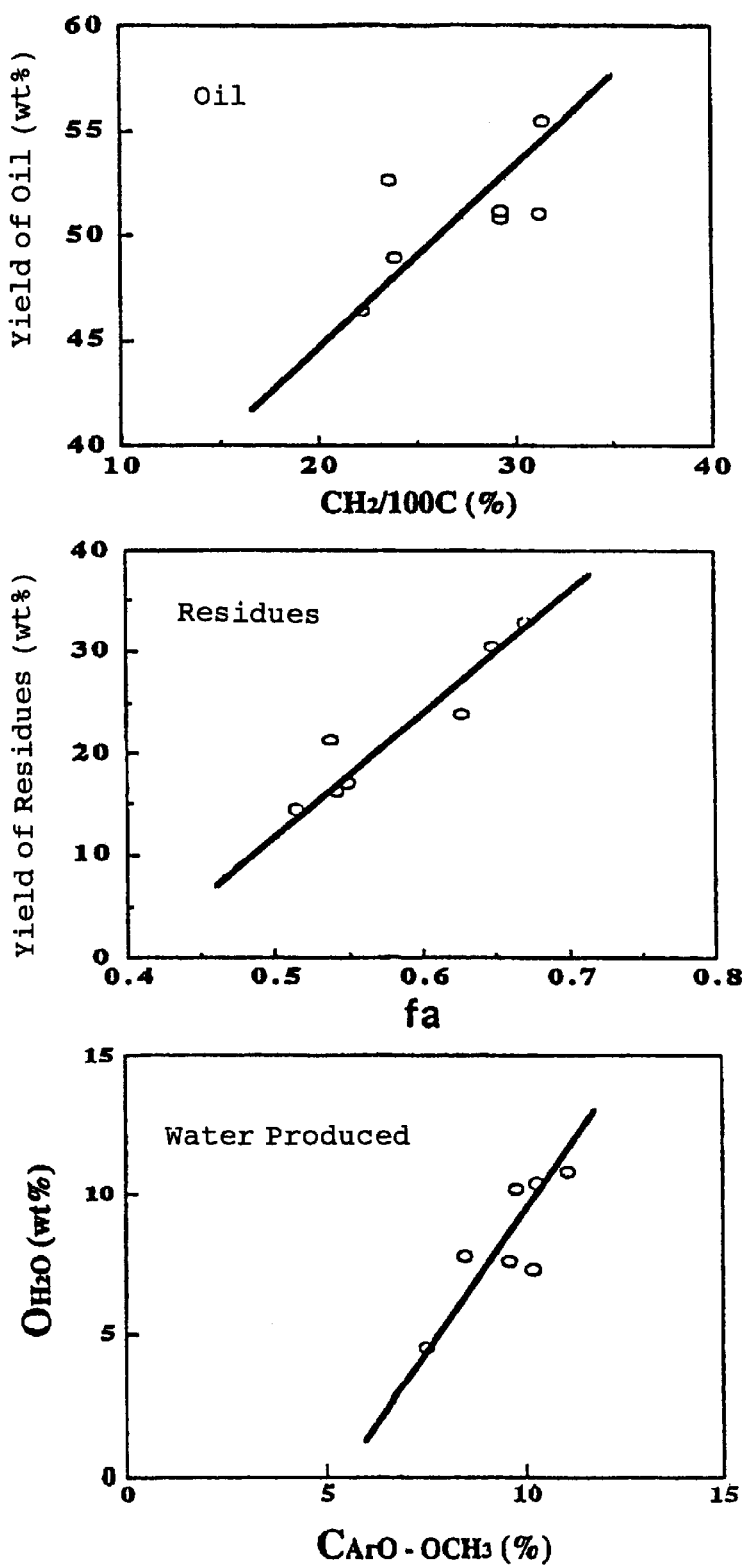
FIG. 2 shows the correlations between each product of liquefaction and a specific carbon group, i.e. the correlation between oil yield and the amount of $CH_2$ group, the correlation between residue yield and fa value, and the correlation between the amount of oxygen in produced water and the amount of $ArO-OCH_3$.

In FIG. 2, there are shown the correlation between each liquefaction product and a specific carbon group, i.e. the correlation between the oil yield and the amount of $CH_2$ group, the correlation between the residue yield and the fa value, and the correlation between the amount of oxygen in produced water and the amount of (ArO—$OCH_3$). As is clear from the diagrams, every product shows a strong correlation with a specific carbon group, which proves that liquefaction reactivity of coal has a close relation with the chemical structure thereof.

In Table 3, there are shown the correlation equations showing the relation between the yield of each liquefaction product and the proportion of a specific carbon group obtained from the correlational diagrams.

Consequently, according to the estimation method of the present invention, a yield of each product of liquefaction of an unknown sample coal can be estimated under a standard condition of NEDOL process.

Additionally, the present invention, as it applies above mentioned method, can make a provision and a comparison of reaction data for an unknown sample coal obtained under a standard condition of NEDOL process without carrying out any liquefaction tests, and make a selection and an evaluation of a suitable coal for a liquefaction reaction easily and rapidly.

What is claimed is:

1. A method of estimating yields of products of liquefaction at 465° C. of coal or its analogues, comprising:

(a) obtaining spectral data of coal or its analogues by using a solid state $^{13}C$ nuclear magnetic resonance spectrometer;

(b) deconvoluting said spectral data into 24 peaks according to Table 1 below and classifying said 24 peaks into 9 carbon groups according to Table 1 below,

TABLE 1

| Peak No. | Peak Position (ppm) | Half-value width (ppm) | Assignment of Carbon |
|---|---|---|---|
| 1 | 11.3 | <12 | $CH_3$ |
| 2 | 18.8 | 9 | |
| 3 | 24–26 | 7 | $CH_2$ |
| 4 | 30–35 | <10 | |
| 5 | 38.9 | 15 | |
| 6 | 49 | 7 | |
| 7 | 54–56 | <10 | $OCH_3$ |

TABLE 1-continued

| Peak No. | Peak Position (ppm) | Half-value width (ppm) | Assignment of Carbon |
|---|---|---|---|
| 8 | 62.5 | <10 | |
| 9 | 72–75 | <10 | R—OH |
| 10 | 80 | 9 | C—O |
| 11 | 84 | 7 | |
| 12 | 89 | 4 | |
| 13 | 100 | <10 | Ar—H |
| 14 | 105 | 5 | |
| 15 | 114–116 | <13 | |
| 16 | 124 | <12 | |
| 17 | 131 | 12 | Ar—C |
| 18 | 140–141 | <12 | |
| 19 | 145–146 | <12 | Ar—O |
| 20 | 150–153 | <14 | |
| 21 | 160 | <14 | |
| 22 | 175 | 15 | COOH |
| 23 | 180 | 15 | |
| 24 | 200 | 15 | C=O | said 9 groups consisting of carbonyl group (C=O), carboxyl group (COOH), aromatic carbon bonded to an oxygen atom (Ar—O), aromatic carbon bonded to a carbon atom (Ar—C), aromatic carbon bonded to a hydrogen atom (Ar—H), aliphatic carbon bonded to a hydroxyl group or an etheric oxygen (R—OH or C—O), methoxyl group ($OCH_3$), methylene group ($CH_2$) and methyl group ($CH_3$);

(c) determining distribution of carbons of the $CH_3$, $CH_2$, C=O, COOH, Ar—O and $OCH_3$ in terms of wt. %, and aromaticity fa from the peak intensity of the spectral data obtained in step (b); and (d) calculating an estimated yield of at least one liquefaction product of the coal or its selected from the group consisting of hydrocarbon gas, COx gas, water, oil and residues according to the following equations:

Hydrocarbon Gas (wt. %)=0.33×($C_{CH2}$+$C_{CH3}$)+6.15

COxGas (wt. %)=1.43×($C_{C=O}$+$C_{COOH}$)−1.45

Water (wt. %)=2.03×($C_{Ar-O}$−$C_{OCH3}$)−10.84

Oil (wt. %)=0.86×$C_{CH2}$+27.5

Residues (wt. %)=122.0×fa−49.2 wherein $C_{CH2}$, $C_{CH3}$, $C_{C=O}$, $C_{COOH}$, $C_{Ar-O}$ and $C_{OCH3}$ represent distribution, in terms of wt. %, of carbons of the $CH_2$, $CH_3$, C=O, COOH, Ar—O and $OCH_3$, respectively.

* * * * *

UNITED STATES PATENT AND TRADEMARK OFFICE
CERTIFICATE OF CORRECTION

PATENT NO. : 6,319,725 B1  
DATED : November 20, 2001  
INVENTOR(S) : Yoshida et al.

It is certified that error appears in the above-identified patent and that said Letters Patent is hereby corrected as shown below:

Title page,
Item "[73], Assignee: Agency of Industrial Science and Technology" should read
-- [73] Assignee: Secretary of Agency of Industrial Science and Technology --.

Column 3,
Line 24, "13C" should read -- $^{13}C$ --.

Column 5,
Line 3, "30" should read -- -30 --.

Signed and Sealed this

Ninth Day of July, 2002

Attest:

Attesting Officer

JAMES E. ROGAN
*Director of the United States Patent and Trademark Office*